US012791585B2

(12) United States Patent
Arora et al.

(10) Patent No.: US 12,791,585 B2
(45) Date of Patent: Nov. 10, 2026

(54) SYSTEMS, APPARATUSES, AND METHODS FOR ON CHIP DYNAMIC IR DROP OSCILLOSCOPE

(71) Applicant: STMicroelectronics International N.V., Geneva (CH)

(72) Inventors: Deepak Kumar Arora, Greater-Noida (IN); Tanisha Gupta, Indore (IN); Shubham Jain, Shivpuri (IN); Anuj Grover, New Delhi (IN)

(73) Assignee: STMicroelectronics International N.V., Geneva (CH)

( * ) Notice: Subject to any disclaimer, the term of this patent is extended or adjusted under 35 U.S.C. 154(b) by 96 days.

(21) Appl. No.: 18/788,967

(22) Filed: Jul. 30, 2024

(65) Prior Publication Data

US 2025/0052788 A1 Feb. 13, 2025

Related U.S. Application Data

(60) Provisional application No. 63/531,679, filed on Aug. 9, 2023.

(51) Int. Cl.
*G01R 13/02* (2006.01)
*G11C 27/02* (2006.01)

(52) U.S. Cl.
CPC .......... *G01R 13/0272* (2013.01); *G11C 27/02* (2013.01)

(58) Field of Classification Search
CPC ............................ G01R 13/0272; G11C 27/02
See application file for complete search history.

(56) References Cited

U.S. PATENT DOCUMENTS

| | | | | |
|---|---|---|---|---|
| 4,507,740 | A * | 3/1985 | Star | G01R 13/345 |
| 4,628,254 | A * | 12/1986 | Bristol | G01R 19/10 |
| 5,963,484 | A | 10/1999 | Jung | |
| 2006/0158947 | A1 | 7/2006 | Chan et al. | |
| 2011/0234282 | A1 * | 9/2011 | Chopra | G11C 29/023 |

(Continued)

FOREIGN PATENT DOCUMENTS

CN 108089624 B 4/2020

OTHER PUBLICATIONS

Wang et al., "TRO: An On-Chip Ring Oscillator-Based GHz Transient IR-Drop Monitor," in IEEE Transactions on Computer-Aided Design of Integrated Circuits and Systems, vol. 36, No. 5, pp. 855-868, (May 2017).

*Primary Examiner* — Paresh Patel
(74) *Attorney, Agent, or Firm* — Alston & Bird LLP

(57) ABSTRACT

Systems, apparatuses, and methods for an on chip dynamic IR oscilloscope are provided. An oscilloscope circuitry may comprise sensor circuitry, voltage generator circuitry, finite state machine, and latch circuitry. The sensor circuitry may include digital logic circuitry, sample and hold circuitry, and sense amplifier circuitry. The voltage generator circuitry may include a voltage generator, analog buffers, switches, and high speed buffer. The finite state machine may control the sensor circuitry to sample a voltage waveform and the voltage generator circuitry to generate a reference voltage that may change over time. The sensing amplifier circuitry may compare the samples to the reference voltage to generate flags when a sample exceeds a reference voltage. The flags may be used to stored the voltages associated with the flags, which may be used to redraw the waveform sampled.

20 Claims, 5 Drawing Sheets

(56) References Cited

U.S. PATENT DOCUMENTS

| | | | | |
|---|---|---|---|---|
| 2012/0126781 | A1 | 5/2012 | Narayanan et al. | |
| 2015/0187414 | A1 | 7/2015 | Perner | |
| 2019/0277887 | A1* | 9/2019 | Landolt | H03K 5/135 |
| 2020/0035292 | A1 | 1/2020 | Guo et al. | |
| 2020/0132727 | A1* | 4/2020 | Lehane | H04L 69/12 |
| 2022/0373577 | A1* | 11/2022 | Xu | G01R 13/02 |

* cited by examiner

SYSTEMS, APPARATUSES, AND METHODS FOR ON CHIP DYNAMIC IR DROP OSCILLOSCOPE

CROSS REFERENCE TO RELATED APPLICATIONS

This application claims priority to U.S. Provisional Patent Application No. 63/531,679 filed on Aug. 9, 2023, which is incorporated herein by reference in its entirety.

TECHNOLOGICAL FIELD

Example embodiments of the present disclosure relate generally to integrated circuits for semiconductors, and more particularly, to oscilloscope circuits for detecting and testing IR drop.

BACKGROUND

Reliable voltages at specified values being supplied on semiconductor chips is needed. Voltage supplies may have voltage drops, spikes, or transients and thus may not provide a flat voltage. These variations may lead to, for example, difficulties with semiconductor chips for debugging silicon failures due to a lack of understanding the voltage waveform (s) supplied to the transistors on the semiconductor chip(s). Also, the chip area on semiconductor chips continue to shrink and the need for low power systems with higher numbers of transistors switching on chips continues to grow. Such shrinking areas make it difficult to incorporate the components of conventional on chip oscilloscopes. Thus there is a need for improvements to oscilloscopes for the monitoring the voltage(s) supplied on semiconductor chips.

New on chip oscilloscopes are needed. The inventors have identified numerous areas of improvement in the existing technologies and processes, which are the subjects of embodiments described herein. Through applied effort, ingenuity, and innovation, many of these deficiencies, challenges, and problems have been solved by developing solutions that are included in embodiments of the present disclosure, some examples of which are described in detail herein.

BRIEF SUMMARY

Various embodiments described herein relate to on chip oscilloscopes, particularly to on chip oscilloscopes for dynamic IR drop.

In accordance with some embodiments of the present disclosure, an example oscilloscope circuitry is provided. The oscilloscope circuitry may comprise: a sensor circuitry including a sample and hold circuitry and a sense amplifier circuitry, wherein the sample and hold circuitry is configured to generate a plurality of samples based at least on a voltage waveform; a voltage generation circuitry including an output coupled to the sense amplifier circuitry, wherein the output is configured to provide a reference voltage; a finite state machine coupled to the sensor circuitry and the voltage circuitry, wherein the finite state machine is configured to operate the sensor circuitry and voltage generation circuitry to compare the plurality of samples to the reference voltage and generate a plurality of flags, wherein comparing each of the plurality of samples to the reference voltage generates a flag of the plurality of flags when the sample exceeds the reference voltage; and a latch circuitry coupled to the finite state machine, wherein the latch circuitry is configured to store a plurality of outputs generated based on the flag.

In some embodiments, the voltage waveform is a dynamic waveform.

In some embodiments, the sample and hold circuitry comprises a plurality of sample and hold circuits, wherein the sense amplifier circuitry comprises a plurality of sense amplifiers, and wherein each sense amplifier of the plurality of sense amplifiers is associated with one sample and hold circuit of the sample and hold circuitry.

In some embodiments, the voltage generator circuitry is configured to generate the reference voltage based at least on a selection of one of a plurality of voltages.

In some embodiments, the selection of the plurality of voltages changes over time based on an input from the finite state machine to the voltage generation circuitry.

In some embodiments, the changes over time to the selection of the plurality of voltages decrements the reference voltage over time.

In some embodiments, the plurality of sample and hold circuits are configured to sample the voltage waveform a different time that is a sample time offset from a previous time the voltage waveform is sampled.

In accordance with some embodiments of the present disclosure, an example apparatus is provided. The apparatus comprising: an oscilloscope circuitry comprising: a sensor circuitry including a sample and hold circuitry and a sense amplifier circuitry, wherein the sample and hold circuitry is configured to generate a plurality of samples based at least on a voltage waveform; a voltage generation circuitry including an output coupled to the sense amplifier circuitry, wherein the output is configured to provide a reference voltage; a finite state machine coupled to the sensor circuitry and the voltage circuitry, wherein the finite state machine is configured to operate the sensor circuitry and voltage generation circuitry to compare the plurality of samples to the reference voltage and generate a plurality of flags, wherein comparing of each of the plurality of samples to the reference voltage generates a flag of the plurality of flags when the sample exceeds the reference voltage; a latch circuitry coupled to the finite state machine, wherein the latch circuitry is configured to store a plurality of outputs generated based on the flag; and a display configured to render the stored plurality of outputs as a waveform.

In some embodiments, the voltage waveform is a dynamic waveform.

In some embodiments, the sample and hold circuitry comprises a plurality of sample and hold circuits, wherein the sense amplifier circuitry comprises a plurality of sense amplifiers, and wherein each sense amplifier of the plurality of sense amplifiers is associated with one sample and hold circuit of the sample and hold circuitry.

In some embodiments, the voltage generator circuitry is configured to generate the reference voltage based at least on a selection of one of a plurality of voltages.

In some embodiments, the selection of the plurality of voltages changes over time based on an input from the finite state machine to the voltage generation circuitry.

In some embodiments, the changes over time to the selection of the plurality of voltages decrements the reference voltage over time.

In some embodiments, the plurality of sample and hold circuits are configured to sample the voltage waveform a different time that is a sample time offset from a previous time the voltage waveform is sampled.

In accordance with some embodiments of the present disclosure, an example method is provided. The method may comprise: sampling a voltage waveform to generate a plurality of samples with a sample and hold circuitry; transmitting the plurality of samples from the sample and hold circuitry to a sense amplifier circuitry; generating, by a voltage generation circuitry, a reference voltage; transmitting the reference voltage from the voltage generator circuitry to the sense amplifier circuitry; comparing, by the sense amplifier circuitry, the plurality of samples to the reference voltage based at least on a plurality of sensor compare signals generated by a finite state machine; generating, by the sense amplifier circuitry, one or more flags based on the comparing of the plurality of samples to the reference voltage when each sample of the plurality of samples exceeds the reference voltage; storing, by latching circuitry, a plurality of outputs generated based on the one or more flags; a latch circuitry coupled to the finite state machine, wherein the latch circuitry is configured to store a plurality of outputs generated based on the flag.

In some embodiments, the voltage waveform is a dynamic waveform.

In some embodiments, the sample and hold circuitry comprises a plurality of sample and hold circuits, wherein the sense amplifier circuitry comprises a plurality of sense amplifiers, and wherein each sense amplifier of the plurality of sense amplifiers is associated with one sample and hold circuit of the sample and hold circuitry.

In some embodiments, generating the reference voltage is based at least on a selection of one of a plurality of voltages.

In some embodiments, the method further comprises: generating, by the finite state machine, an output for selecting the one of the plurality of voltages for the reference voltage; transmitting the output for selecting the one of the plurality of voltages from the finite state machine to the voltage generator circuitry; changing, by the finite state machine, the output for selecting the one of the plurality of voltages for the reference voltage over time; and changing, by the voltage generator circuitry, the reference voltage based at least on the changes of the output for selecting the one of the plurality of voltages for the reference voltage.

In some embodiments, the changes over time to the selection of the plurality of voltages decrements the reference voltage over time.

The above summary is provided merely for purposes of summarizing some example embodiments to provide a basic understanding of some aspects of the disclosure. Accordingly, it will be appreciated that the above-described embodiments are merely examples and should not be construed to narrow the scope or spirit of the disclosure in any way. It will also be appreciated that the scope of the disclosure encompasses many potential embodiments in addition to those here summarized, some of which will be further described below.

BRIEF SUMMARY OF THE DRAWINGS

Figure 1:
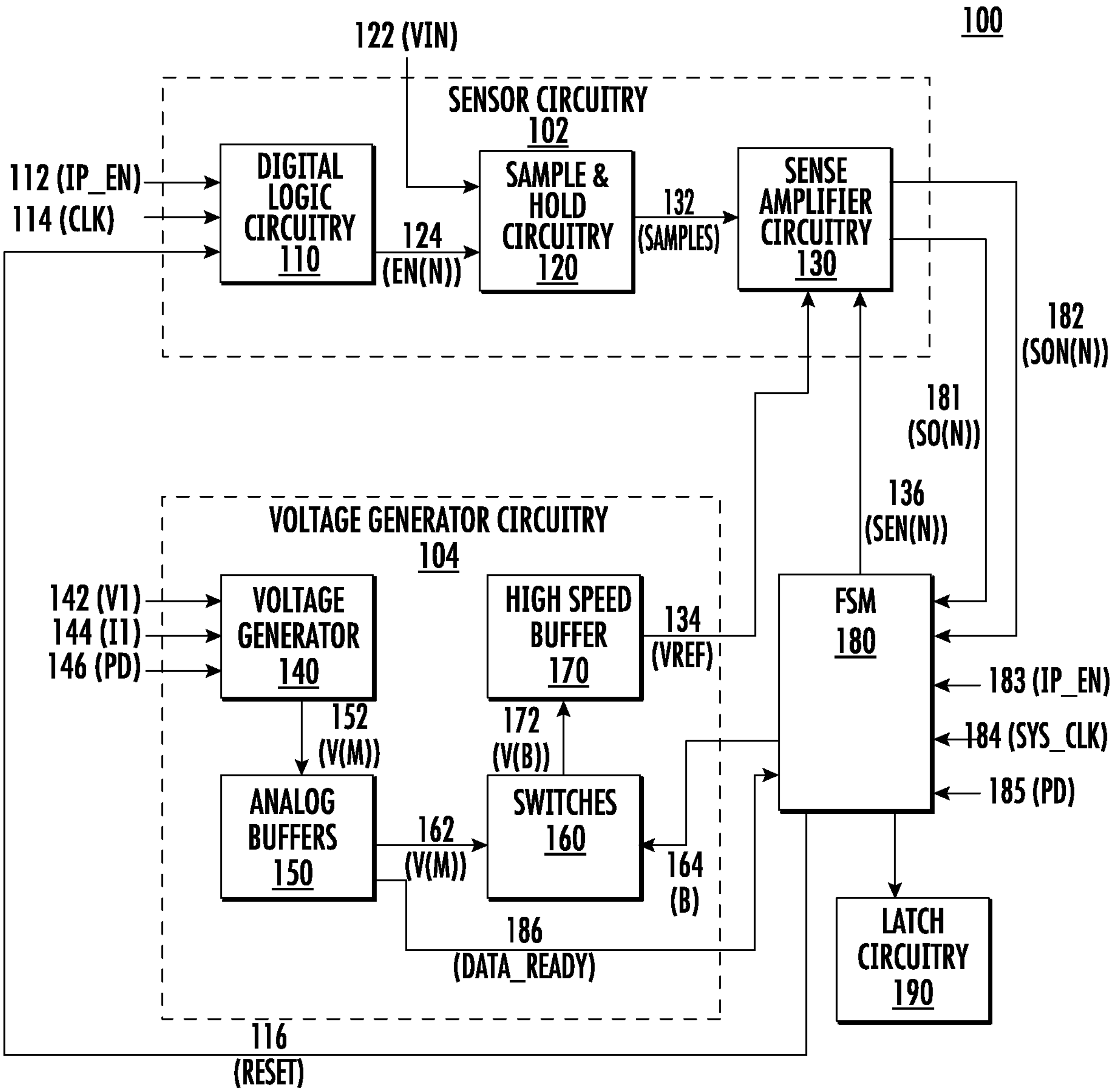
Figure 2:
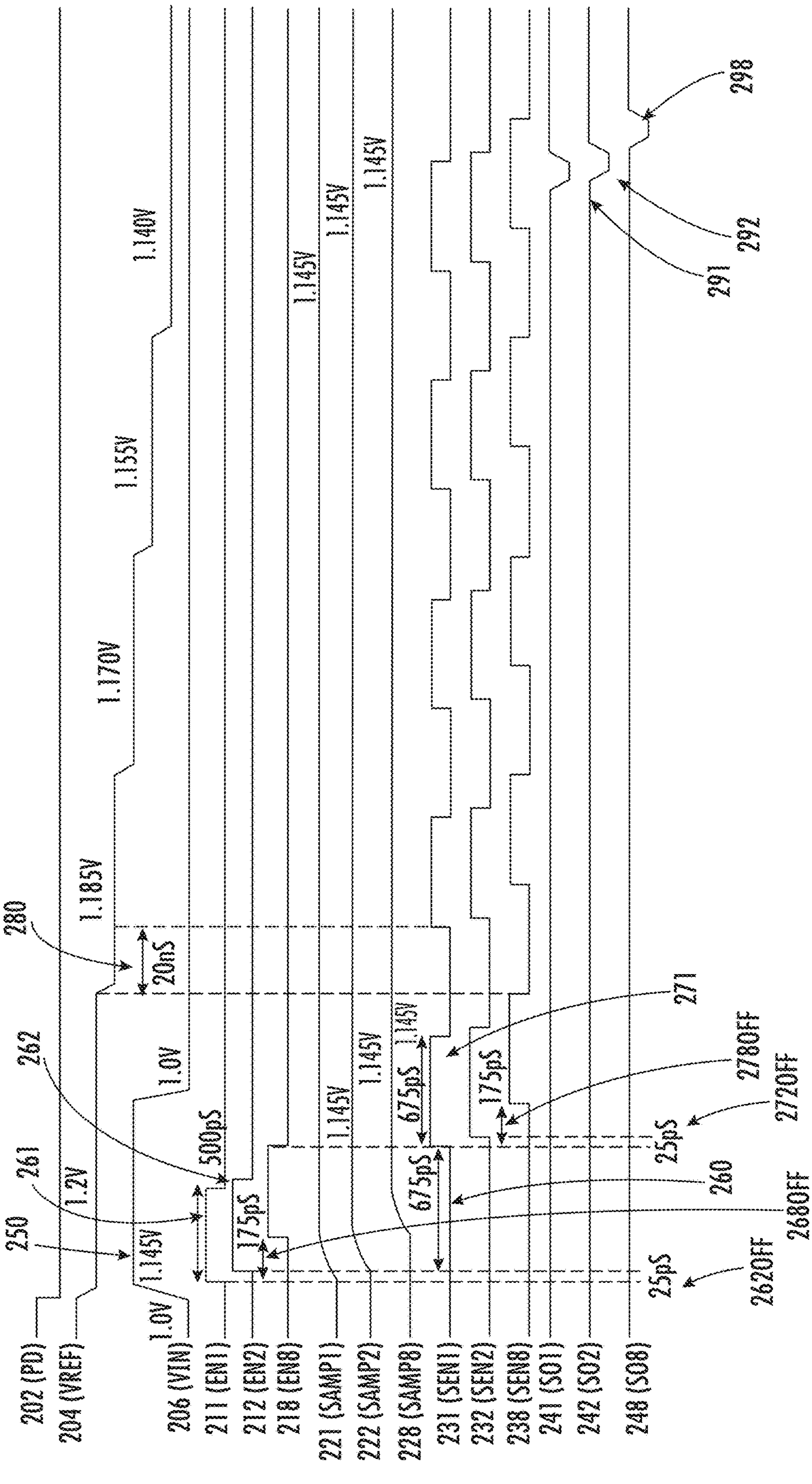
Figure 3:
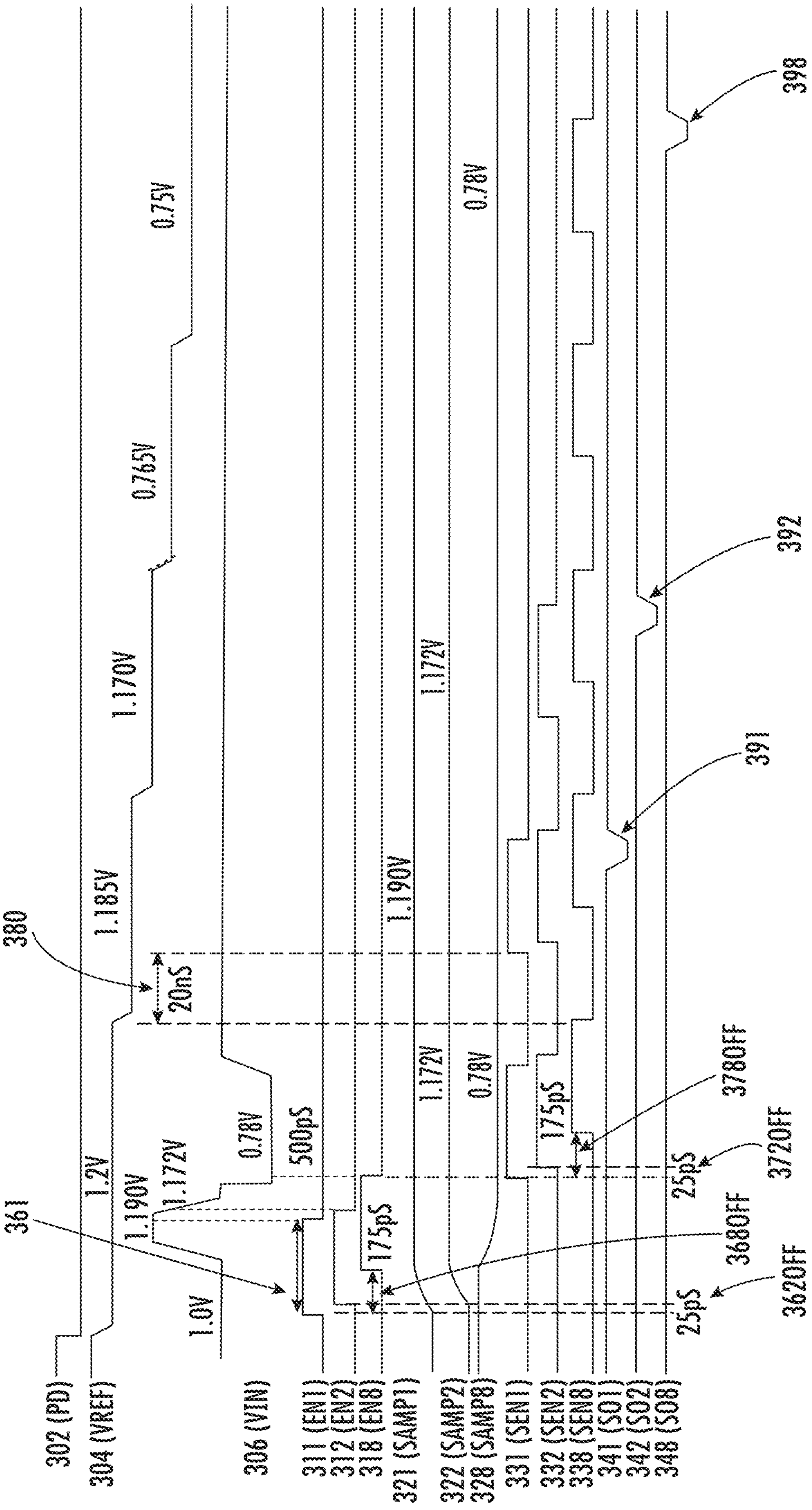
Figure 4:
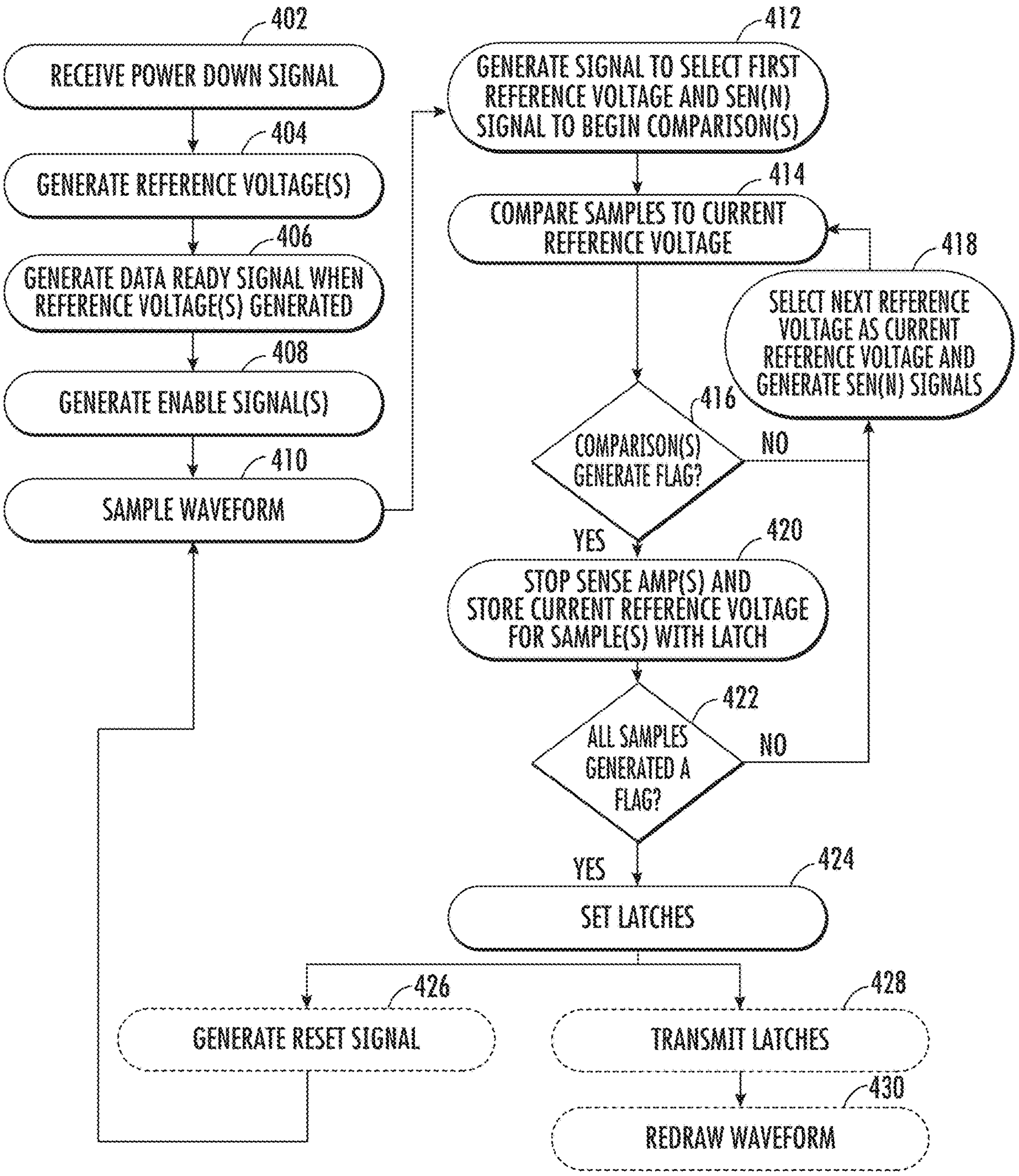
Figure 5:
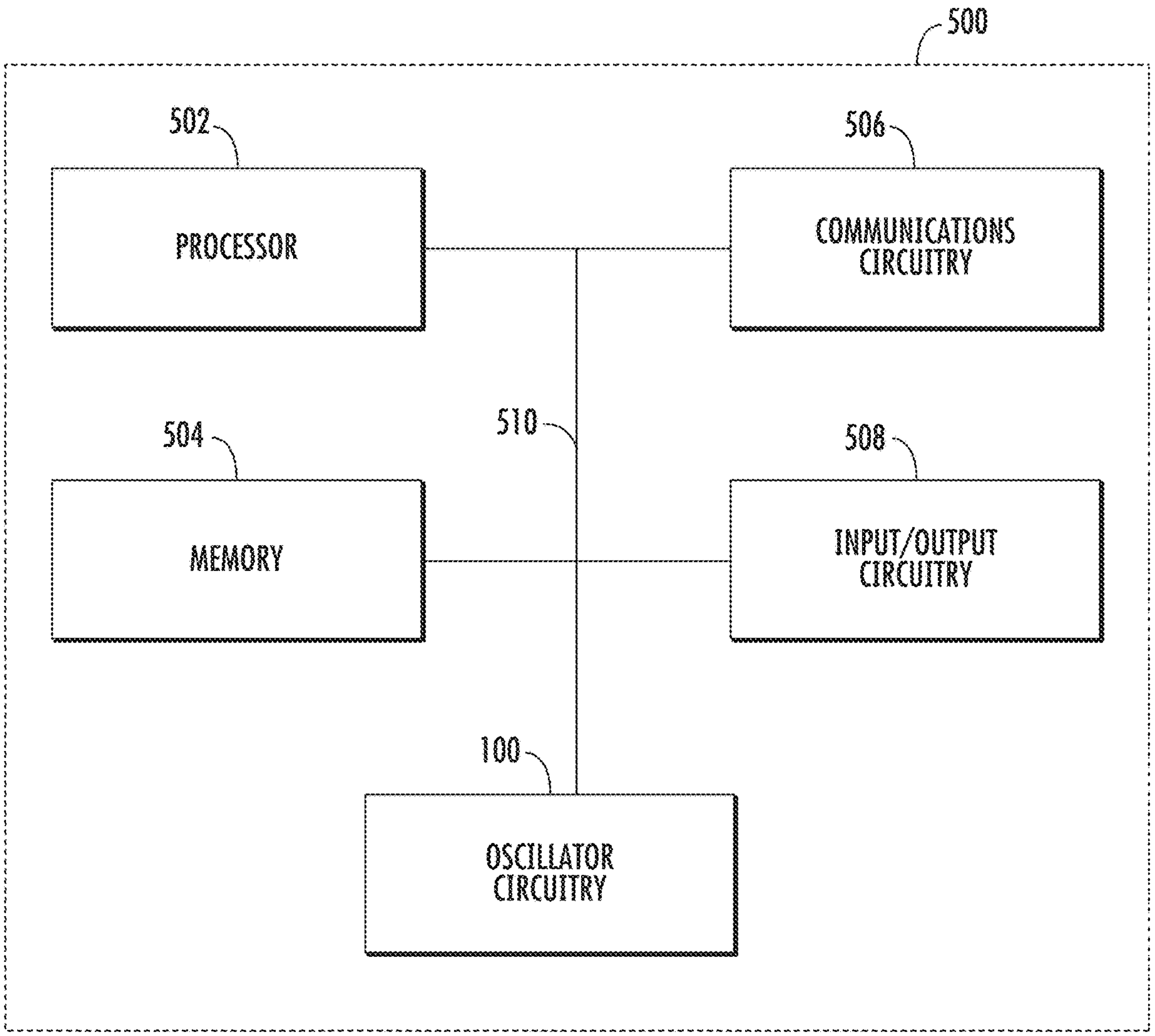

Having thus described certain example embodiments of the present disclosure in general terms, reference will now be made to the accompanying drawings, which are not necessarily drawn to scale, and wherein:

FIG. 1 illustrates an example block diagram of oscilloscope circuitry in accordance with one or more embodiments of the present disclosure;

FIG. 2 illustrates a first example timing graph in accordance with one or more embodiments of the present disclosure;

FIG. 3 illustrates a second example timing graph in accordance with one or more embodiments of the present disclosure;

FIG. 4 illustrates an example flowchart of operations for the oscilloscope circuitry in accordance with one or more embodiments of the present disclosure; and FIG. 5 illustrates an example block diagram of a system or apparatus with oscilloscope circuitry in accordance with one or more embodiments of the present disclosure.

DETAILED DESCRIPTION

Some embodiments of the present disclosure will now be described more fully herein with reference to the accompanying drawings, in which some, but not all, embodiments of the disclosure are shown. Indeed, various embodiments of the disclosure may be embodied in many different forms and should not be construed as limited to the embodiments set forth herein; rather, these embodiments are provided so that this disclosure will satisfy applicable legal requirements. Like reference numerals refer to like elements throughout.

As used herein, the term "comprising" means including but not limited to and should be interpreted in the manner it is typically used in the patent context. Use of broader terms such as comprises, includes, and having should be understood to provide support for narrower terms such as consisting of, consisting essentially of, and comprised substantially of.

The phrases "in various embodiments," "in one embodiment," "according to one embodiment," "in some embodiments," and the like generally mean that the particular feature, structure, or characteristic following the phrase may be included in at least one embodiment of the present disclosure and may be included in more than one embodiment of the present disclosure (importantly, such phrases do not necessarily refer to the same embodiment).

The word "example" or "exemplary" is used herein to mean "serving as an example, instance, or illustration." Any implementation described herein as "exemplary" is not necessarily to be construed as preferred or advantageous over other implementations.

If the specification states a component or feature "may," "can," "could," "should," "would," "preferably," "possibly," "typically," "optionally," "for example," "often," or "might" (or other such language) be included or have a characteristic, that a specific component or feature is not required to be included or to have the characteristic. Such a component or feature may be optionally included in some embodiments or it may be excluded.

The use of the term "circuitry" as used herein with respect to components of a system or an apparatus should be understood to include particular hardware configured to perform the functions associated with the particular circuitry as described herein, including associated electrical components (e.g., resistors, inductors, capacitors, transistors, amplifiers, etc.). The term "circuitry" should be understood broadly to include hardware and, in some embodiments, software for configuring the hardware. For example, in some embodiments, "circuitry" may include processing circuitry, communications circuitry, input/output circuitry, and the like. In some embodiments, other elements may provide or supplement the functionality of particular circuitry.

Overview

Various embodiments of the present disclosure are directed to improved oscilloscope circuitry. Various embodiments may include the oscilloscope circuitry incorporated into semiconductor chips to measure voltage waveforms input to the oscilloscope circuitry. These waveforms may then subsequently be stored and/or transmitted to other circuitry, apparatuses, or systems for us in various operations, such as described herein.

Reliable voltages at specified values being supplied is needed, such as to transistors to ensure the transistors' functionality. While an ideal power supply or voltage supply would generate a voltage at a set value, ideal power supplies and/or voltage supplies do not exist. Available power supplies and/or voltage supplies may include drops, spikes, transients, distortions, or the like. Sometimes the voltage may be higher or lower, and these higher or lower voltages may be for various amounts of time, including very short periods of time.

Variations may lead to IR drop. IR drop may be used herein to refer to a drop or change in voltage. These changes in a voltage waveform may be sampled at one or more points in a system and/or apparatus. These samples may be compared or measured against another reference voltage. There are generally two types of IR drop. There may be a static IR drop or a dynamic IR drop. A static IR drop may be, for example, a step down in the voltage. A dynamic IR drop may be, for example, a transient change in the voltage for a short period of time. Such transients may be associated with various operations of a circuit, such as switching, input signals to a power supply, or operation of other components coupled to a power supply. Such transients may also lead to circuit timing failure and/or circuit function failure. This may cause, for example, signal integrity degradation, introduction of power noise in power supply nets, and change(s) in delay of cells. While the phrase IR drop includes the word drop, it will be understood that IR drop may include a rise in voltage.

Conventional manner of measuring these voltages variations may lead to difficulties for debugging silicon failures of semiconductors due to a lack of understanding the voltage waveforms supplied to the transistors or other circuitry of a semiconductor. For example, conventional manners may indicate an undershoot or, alternatively, an overshoot at a single point, but conventional manners may be able to provide the improvements described in the present disclosure.

Embodiments of the present disclosure may include a number of improvements as described herein. For example, embodiments may allow for a capturing a static and a dynamic waveform. For example, this may be done by sampling a plurality of points over time of a voltage waveform. Embodiments may allow for a voltage resolution in how much under or over a voltage transient is to specified voltage. Additionally, embodiments may provide a time resolution or time window may be provided for how an IR drop may vary over short periods of time. Also, embodiments may provide processing multiple samples of an IR drop, such as a transient, in parallel. Additional improvements are discussed herein, including improvements that will be recognized by a person of skill in the art.

As described further herein, embodiments of oscilloscope circuitry in accordance with the present disclosure may include sensor circuitry, voltage circuitry, a finite state machine (FSM), latch circuitry, and other components and/or circuitry for use in an on chip oscilloscope. The sensor circuitry may sample a voltage waveform and compare the samples against reference voltage(s) generated by the voltage circuitry. The output of the comparison of the samples may be stored in latch circuitry. Operations may be controlled by, among other things, the FSM. The output stored in the latch circuitry may be used to generate or redraw the sampled voltage waveform. In various embodiments, embodiments in accord with the present disclosure may be used to measure dynamic IR drop(s), such as in test circuitry on a semiconductor device, such a semiconductor chip.

Semiconductor devices continue to shrink in size and need lower power systems. Embodiments of the present disclosure may utilize a plurality of sense amplifiers, which may be smaller in size have lower power requirements than, for example, analog-to-digital converters. The sense amplifiers may allow for analyzing a plurality of samples of voltages from a sampled waveform in parallel. This parallel processing provides for higher processing throughput and fasters processing speeds. Also, in various embodiments, the comparison of multiple samples may be performed at different time instants without needing duplicative circuitry. The timing may be controlled by a FSM, which may control the reference voltage used in the comparison and the sample being compared. The FSM may have lower overhead in operating embodiments of the present disclosure. Also, due to the parallel processing, the time to compare multiple samples may no longer be directly dependent on serially processing the number of samples. Moreover, the present disclosure may allow for the comparison of samples at frequencies up to and exceeding the GHz range of frequencies. Additionally, as described herein, one voltage circuitry may be used with a plurality of sensor circuitries. This may allow for multiple waveforms to be sampled at once.

Embodiments of the present disclosure may use a multi-sensor method that may work at different time intervals and follow transients. In particular, multiple sense amplifiers working in parallel may follow the transient voltage waveform with a common FSM controlling the reference voltage generator and sense amplifiers.

Embodiments of the present disclosure provide on-chip dynamic IR drop solutions that may enable in-depth voltage drop characterization.

For example, embodiments of the present disclosure may extract dynamic voltage drop values for a voltage waveform, which may have a frequency of 1 GHz or higher.

Embodiments may use different timing steps, which may for example provide voltage drop resolution of approximately 15 mV and time resolution of approximately 25 ps.

Example embodiments of the present disclosure may be applied in many different embodiments and/or implementations. For example, in high computational processing applications, embodiments of the present disclosure may be implemented as a dynamic voltage drop sensor on SOC that can detect DC levels and high frequency transients of power supply voltage to generate flags to avoid any functional failures. Example embodiments may be used as in system monitoring, such as where voltage going below a threshold value may trigger an action, such as a reset, to increase a supply voltage(s), etc. Example embodiments of the present disclosure may provide cost saving during debugging of chips to find root cause(s) of failures.

Systems and apparatuses in accordance with the present disclosure may, for example, be or include test-chips for qualification of technology design platforms, apparatuses, or systems. Examples also include systems and apparatus for monitoring voltage(s), which may assist with alarming, identifying, and/or avoiding failures or the like.

Exemplary On Chip Oscilloscope Circuitry and Timing Charts

Embodiments of the present disclosure herein include systems, apparatuses, and methods including and/or using an on chip oscilloscope, such as described herein and which may be implemented in various embodiments.

FIG. 1 illustrates an example block diagram of oscilloscope circuitry in accordance with one or more embodiments of the present disclosure. As illustrated, the oscilloscope circuitry 100 may include sensor circuitry 102, voltage generator circuitry 104, finite state machine 180, and latch circuitry 190. The sensor circuitry 102 may include digital logic circuitry 110, sample and hold circuitry 120, and sense amplifier circuitry 130. The voltage generator circuitry 104 may include a voltage generator 140, analog buffers 150, switches 160, and high speed buffer 170.

As illustrated, the circuitries and components of the oscilloscope circuitry 100 may be coupled, which may allow for the transmission and receiving of signals. Signals may be received from couplings outside of the oscilloscope circuitry 100. In various embodiments, an input enable signal 112 (IP_EN) and 183 (IP_EN), voltage in clock signal 114 (CLK), voltage 142 (V1), current 144 (I), power down signal 146 (PD) and 185 (PD), system clock signal 184 (SYS_CLK). The clock signal 114 (CLK) may be a clock signal used by the components associated with the voltage waveform 122 (VIN). The system clock signal 184 (SYS_CLK) may be a clock signal used by the system. In various embodiments, the system clock signal 184 (CLK) may be the same as the voltage in clock signal 114 (CLK). In various embodiments, the system clock signal 184 (CLK) may be different than the voltage in clock signal 114 (CLK). In various embodiments, there are additionally couplings to circuitry and/or components outside of the oscilloscope circuitry 100, such as couplings for reading out the latch circuitry 190 as described herein. Additional signals illustrated in FIG. 1 are described herein.

The digital logic circuitry 110 may include multiplexers, logic gates, inverter chain(s), etc. The digital logic circuitry 110 may generate an enable signal 124 (EN(N)) to provide to the sample and hold circuitry 120 to sample a voltage waveform 122 (VIN). The enable signal 124 (EN(N)) may be comprises of a plurality of enable signals that may provide to the sample and hold circuitry 120 when each sample and hold circuit is to begin. For example, in various embodiments there may be 8 sample and hold circuits and the enable signals 124 may be provided in sequence with a timing offset between each enable signal, such as a 25 pS offset. The timing offset may provide a time resolution or timing resolution as each sample may be spaced apart by the offset.

The sample and hold circuitry 120 may include one or more sample and hold circuits that would sample a waveform provided by a voltage waveform 122 (VIN). The voltage waveform 122 (VIN) is where an IR drop may be present. The voltage waveform 122 (VIN) may be sampled a plurality of times at different times separated by the voltage offset (e.g., 25 pS apart). In various embodiments, the sampling may be a sweep in the time domain or time scale. This sampling may be started based at least one an enable signal 124 (EN(N)). Alternatively or additionally, various embodiments may include this sampling be shifted to start after a time period after the enable signal. For example, such a shift may be utilized to ensure an IR drop or transient behavior is not missed in the sampling of voltage waveform 122 (VIN), such as if a transient may not occur at the time of the enable signal. The sample and hold circuits will hold each of the samples. The samples may be output as sample signals 132 (SAMPLES). The plurality of sample and hold circuits may provide the sample signals 132 (SAMPLES) in parallel to a plurality of sense amplifiers in the sense amplifier circuitry 130. This may be part of what allows for multiple samples to be processed in parallel. In various embodiments, a sampling of the voltage waveform 122 (VIN) may be shifted based on the number of sense amplifiers in the plurality of sense amplifiers. For examples, if a number of available sense amplifiers may be less than a range of transient behavior, such as based on the number of sensing amplifiers and the plurality sampling rate (e.g., every 25 pS), the starting time for sampling the voltage waveform 122 (VIN) may be shifted from a time of an enable signal by a shift time period. In various embodiments, the shifting time period as well as the sampling rate may be associated with the number of sensing amplifiers.

The sense amplifier circuitry 130 may include a plurality of sense amplifiers. The number of sense amplifiers in the sense amplifier circuitry 130 may be the same as the number of sample and hold circuits in the sample and hold circuitry 120. Alternatively, the number of sense amplifiers may be different than the number of sample and hold circuits. The sense amplifiers may compare the samples received against a reference voltage. The comparison may result in one or more digital outputs. For example, each sense amplifier may output a sense output signals 181 (SO(N)) and a sense output not signals 182 (SON(N)). The sense output not signals 182 (SON(N)) may be the inverse of the associated sense output signals 181 (SO(N)). In various embodiments, one or both of the sense output signals 181 and/or the sense output not signals 182 may be provided to the FSM.

In various embodiments, the sense output signals 181 may be a first value (e.g., 1) that change to a second value (e.g., 0) when the comparison of the sample falls below a reference voltage in a comparison. As different reference voltages as compared to a sample, the first switching of the sense output signals 181 from a first value (e.g., 1) to a second value (e.g., 0) may be referred to as generating a flag or indicator. The flag represents the first reference voltage that would be below (or above) the sample. It will be appreciated that the sense output not signals 182 similarly generates flags, but these are the inverse of the flags of an associated sense output signals 181 (e.g., a first value of 0 may change to a value of 1). These values would a bit change and/or change in voltage.

The voltage generator circuitry 104 may generate a reference voltage 134 (VREF) that may be provided to the sensor circuitry 102. The FSM 180 may control how the voltage generator circuitry 104 generates and provides the reference voltages 134 (VREF).

The voltage generator 140 may generate a plurality of voltages 152, which may be referred to herein as M number of voltages 152 or M voltages 152. In various embodiments, the voltage generator 140 may generate 64 different reference voltages. For example, a first reference voltage may be 1.2 V and each subsequent reference voltage may be one voltage step or increment down. This may have the first reference voltage of 1.2V, a second reference voltage of 1.185V, etc. The 0.015 V step down may be referred to as providing a voltage resolution of 0.015V. The M number of voltages 152 may be provided to buffers 150.

The voltage generator 140 may generate a voltage based on at least one or more of a plurality of input signals, such as a voltage 142 (V1), a current 144 (I1), and/or a power down signal 146 (PD). The voltage 142 (V1) and/or current 144 may be provided from an exterior voltage source or current source, respectively. The power down signal 146 (PD) may be the same power down signal as the power down signal 185 (PD) or it may be different. The power down signal 146 may be used to provide that one or more other portions of the system and/or apparatus have been powered down. Such a powering down may be used to control how a voltage waveform 122 may be experiencing an IR drop or transient. The power down signal 146 may thus be used as an enable signal for the voltage generator 140, which may wait to generate one or more voltages 152 until after receiving the power down signal 146.

The analog buffers 150 may include M number of analog buffers. Thus the M number of analog buffers 150 may each be associated with one of the M number of voltages 152. The analog buffers 150 may buffer their respective voltage 152 to provide voltages 162 at a consistent voltage level without transients or changes. The analog buffers 150 isolate the voltages 152 from parasitic signals so that they may be subsequently provided to other components. The analog buffers 150 may provide M voltages 162 to switches 160. The analog buffers 150 may also provide a data ready signal 186 (DATA_READY) to the FSM 180.

The switches 160 may include a plurality of switches. There may be one switch for each of the voltages 162 (V(M)). In other words, various embodiments may include M number of switches, with one switch for each of the M number of voltages being provided from the analog buffers 150. The switches 160 may receive a switch selection signal 164 (B) from the FSM 180 to determine which of the switches (e.g., switch B) to operate to provide the selected reference voltage 172 (V(B)) to the high speed buffer 170. If a switch of the plurality of switches in switches 160 is not being operated then it may be shorted to ground. Thus only one selected reference voltage 172 (V(B)) may be provided to the high speed buffer 170 at a time.

The high speed buffer 170 may received a selected reference voltage 172 (V(B)) from the switches 160. The high speed buffer 170 may be used to stabilize the selected reference voltage 172 (V(B)) by buffering this signal and outputting a reference voltage (VREF). The stabilizing may include removing any transients from switching. In various embodiments, the high speed buffer 170 may be a plurality of high speed buffers with one high speed buffer associated with each of the plurality of switches in switches 160. Thus each switch of switches 160 may be associated with its own high speed buffer 170, such as in a pairing.

The FSM 180 is a finite state machine that may control one or more operations of the oscilloscope circuitry 100. The FSM may receive a plurality of input signals, such as sense output signals 181 (SO(N)), sense output not signals 182 (SON(N)), enable signal 183 (IP_EN), system clock signal 184 (SYS_CLK), power down signal 185 (PD), and data ready signal 186 (DATA_READY).

The enable signal 183 (IP_EN) may be an enable signal to instruct the FSM to proceed with operations. The power down signal 185 (PD) may provide that a system or apparatus the oscilloscope circuitry 100 is measuring a voltage waveform 122 (VIN) has been powered down as some embodiments may not want to the remainder of the system and/or apparatus operating during use of the oscilloscope circuitry 100. The data ready signal 186 (DATA_READY) may provide that the voltage generator 140 has provided voltages 152 (V(M)) to the analog buffers and that these voltages have been buffered and are ready to by the switches 160.

The FSM 180 may generate a plurality of output signals to control the operations, including, switch selection signal 164 (B), sensor compare signals 136 (SEN(N)), and reset signal 116 (RESET).

The switch selection signal 164 (B) may provide which switch of switches 160 to select to provide a selected reference voltage 172 (V(B)) to the high speed buffer 170 and, thus, the voltage reference signal 134 (VREF) to the sense amplifier circuitry 130 for use in comparison(s). The sensor compare signals 136 (SEN(N)) may provide which comparisons for the sense amplifier circuitry 130 to perform. The reset signal 116 (RESET) may when to reset the sensor circuitry 102 so that new samples may be sampled.

The sense output signals 181 and/or sense output not signals 182 may be received by the FSM 180. A change of the sense output signals 181 and/or sense output not signals 182 indicates when a comparison of a sample falls below (or is above) the particular reference voltage 134 (VREF) being used in the comparison. Based on the sense output signals 181 and/or sense output not signals 182, the FSM may determine to proceed from a current switch of switches 160 to the next switch. This change from the current switch to the next switch causes the next voltage signal 162 (V(M)) to be used as the reference voltage 134 (VREF) for comparing against the samples. This decrements (or increments) the voltages used in the comparison(s) until the voltage just below (or above) the sample is determined. As flags are generated by the sample comparisons, which indicates when a reference voltage is below (or above) the sample, the FSM may cause one or more latches of the latch circuitry 190 to latch and to stop one or more sense amplifiers from performing further comparisons. The stopping of the one or more sense amplifiers from being used in further comparisons may be controlled by generating a sensor compare signals 136 (SEN(N)) that omits one or more of the sense amplifiers. Thus as flags are generated for a sample that sample no longer needs to be used in further comparisons, and this improves the speed of further comparisons. After each sample has generated a flag, the FSM may stop iterating through further voltage signals 162 (V(M)). Additionally, the FSM 180 may generate a reset signal 116 (RESET) causing the sensor circuitry 102 to reset and being processing additional samples.

The latch circuitry 190 may capture the reference voltages corresponding to when a flag was generated for each of the samples in the sample and hold circuitry 120. Thus there is at least one latch in the latch circuitry 190 for each of the sense amplifiers in the sense amplifier circuitry 130. The latch circuitry 190 will capture the flag associated with a sample and store the associated reference voltage that generated the flag. This may be done by storing the voltage associated with the sample. Alternatively or additionally, this may be done by storing the switch number associated with the flag, which may be used to determine an associated reference voltage when reading out the stored values. In various embodiments the latch circuitry 190 may be associated with one or more registers. The values of the voltage generating the flag may be stored in the one or more registers associated a respective latch so that the voltage value may later be read out.

In an various embodiment, a system, apparatus, and/or method may include on voltage generator circuitry 104 and a plurality of sensor circuitry 102. The FSM 180 may control the voltage generator circuitry 104 to provide reference voltages 134 (VREF) to the plurality of sensor circuitries 102 to test multiple voltage waveforms, one with each sensor circuitry 102.

In an various embodiments, the oscillator circuity 100 may compare 8 samples in parallel. For example, a digital logic circuitry 110 may receive an input enable (IP_EN) signal 112 signal and generate 8 enable signals 124 signals (EN(8)). In various embodiments, the input (IP) may be a signal, input from a circuitry, input from a macro, input from a supporting device, or the like that is being monitored by the oscilloscope circuitry 100 for an IR drop to be measured, sampled, stored, and the like by the oscilloscope circuitry 100. The input enable (IP_EN) signal 112 may be an enable signal associate with or whose signal needs to be measured for IR drop. The input enable (IP_EN) signal 112 may provide for when the oscilloscope circuitry 100 may monitor and measure for IR drop. Each of the enable signals 124 (EN(8)) signals may be spaced apart from the next by a timing offset of 25 pS. These offsets may be determined based at least on the voltage in clock signal 114 (CLK). The sample and hold circuitry 120 may receive the enable signals 124 (EN(8)) signals and sample a voltage waveform 122 (VIN) at 8 separate times, one for each of the 8 enable signals 124 (EN(8)) (i.e., for EN(1), EN(2), . . . EN(8)). Thus 8 samples were taken by 8 sample and hold circuits of the sample and hold circuitry 120. These 8 samples were provided as samples 132 to 8 sense amplifiers of the sense amplifier circuitry 130 for comparison against a voltage reference signal 134 (VREF).

The voltage reference signal 134 (VREF) is generated by the voltage generator circuitry 104. The voltage generator 140 may receive a voltage 142 (V1) and generate a 64 voltages V(64). These 64 voltages voltage may include a first voltage at 1.2 V and each subsequent voltage may be offset by a voltage offset prior. Thus the first voltage V(1) may be 1.2 V and the second voltage V(2) may be offset by 0.015 V for the second voltage being 1.185 V and so on for each of the 64 voltages. These 64 voltages are provided in voltages 152 (V(64)) to 64 analog buffers of the analog buffers 150. The analog buffers 150 stabilize the 64 voltages V(64) and then provide voltages 162 (V(64) to switches 160 and a data ready signal 186 (DATA_READY) to the FSM 180. The switches 160 includes 64 switches, one for each of the 64 voltages. The FSM 180 provides a switch number B of 1 to 64 to switches 160 to operate one of the 64 switches to provide a voltage V(B) to high speed buffer 170. The high speed buffer 170 stabilizes the voltage received and provide this reference voltage 134 (VREF) to the sense amplifier circuitry 134 for comparison.

Each of the 8 sense amplifiers compares the reference voltage 134 (VREF) to each of the samples 132. If a sample is below the reference voltage then the associated sense output signal 181 (SO(N)) and the sense output not signal 182 (SON(N)) do not change state.

The 8 sense amplifiers generate output signals of sense output signals 181 (SO(8)) and sense output not signals 182 (SON(8)) are provided to the FSM as inputs. Based on these signals from the 8 sense amplifiers, the FSM 180 controls the switches 160. For example, if the output signal from any one of the 8 sense amplifiers does not indicate a flag (in other words, if not all the N samples are more than the reference voltage), the FSM 180 provides for the next switch of the switches 160 to be used to generate the next reference voltage 134 (VREF) (e.g. decrease the reference voltage by 15 mV).

These signals are provided to the FSM 180 and if there is not change in state the FSM 180 provides the switch selection signal 164 to operate the next switch, which results in the next reference voltage 134 (VREF) being provided for comparison. Thus the reference voltage 134 (VREF) may iterate through voltages until a comparison results in a state change in each of the sense output signals 181 (SO(8)) and sense output not signals 182 (SON(8)). Each state change generates a flag, which is used by the FSM 180 to stop comparing reference voltage (VREF) against a particular sample by removing a sense amplifier value from the sensor compare signals 136 (SEN(8)). Also, as a flag is generated the FSM 180 provides the flag to the latch circuitry 190 to latch and store the value of the reference voltage (VREF) used to generate the flag. The latch circuitry 190 thus captures and stores the reference voltage information as well as the flag information from the 8 sense amplifiers.

As described with this example, the present disclosure provides for comparing a plurality of samples in parallel to follow the transient voltage waveform in a timing window (which may be independent of frequency). A common FSM 180 and reference voltage generator circuitry 104 may check the voltage values of a plurality of samples, which reduces the area and power consumption required to analyze samples.

Examples embodiments describing this are illustrated in the timing graphs of FIGS. 2 and 3.

FIG. 2 illustrates a first example timing graph in accordance with one or more embodiments of the present disclosure. In the embodiments illustrate in FIG. 2 there are 8 samples being captured and compared against a plurality of reference voltages 204 (VREF) that are generated over time. The timing graph of FIG. 2 illustrates various of the signals received and generated by the oscilloscope circuitry 100, including a power down signal 202 (PD), a voltage reference signal 204 (VREF), a voltage waveform 206 (VIN), three of the plurality of enable signals (EN(N)) generated by the digital logic circuitry 110 at 211 (EN1), 212 (EN2), and 218 (EN8), three of the samples captured by three sample and hold circuits of the sample and hold circuitry 120 at 221 (SAMP1), 222 (SAMP2), and 228 (SAMP 8), three of the sense signals generated by the FSM 180 at 231 (SEN1), 232 (SEN2), and 238 (SEN8), and three sense output signals generated by three sense amplifiers of the sensing amplifier circuitry 130 at 241 (SO1), 242 (SO2), and 248 (SO8).

The timing graph begins with a power down signal 202 (PD) signal being received, which goes from 1 to 0. This signal then begins the generation of the reference voltages 204 at a first reference voltage at 1.2 V. The reference voltage 204 (VREF) decrements over time and this is used for comparing against the samples.

Also, the sensing circuitry 102 captures the waveform of voltage waveform 206 (VIN) by sampling the voltage waveform 206 (VIN) at different times associated with the enable signals, illustrated as 211 (EN1), 212 (EN2), and 218 (EN8). The voltage waveform 206 has a transient that rises from 1 V to 1.145 V and then falls to 1 V. The rise to 1.145V is for a waveform time window 250. These enable signals may be generated by the digital logic circuitry 110 and provided to the sample and hold circuitry 130. The sample and hold circuitry 130 samples the voltage waveform 206 (VIN) at the timing of the enable signals, which is offset. While only three enable signals (i.e., 211, 212, and 218) are illustrated, it will be appreciated that the embodiment includes 8 enable signals with numbers 4-7 omitted. The sample and hold circuitry 130 will sample the voltage waveform 206 (VIN) at the times of the enable signals. In various embodiments, the sample and hold circuitry 130 may sample the voltage waveform 206 (VIN) at the falling edge of an enable signal (e.g., 211 (EN1). Alternatively or additionally, samples of the voltage waveform 206 (VIN) may be taken at the rising edge of an enable signal (e.g., 211 (EN1)) or a certain time period after the rising edge. Thus the first sample 221 (SAMP1) samples the voltage waveform 206 (VIN) at the time of the rise of the first enable signal 211 (EN1), which is also when the first sample begins to charge from 0V to the 1.145V. Similarly, the second enable signal 212 (EN2) through the eighth enable signal 218 (EN8) sample the voltage waveform 206 (VIN) and charge these samples to the sampled voltage. As illustrated, the second enable signal 212 (EN2) is offset from the first enable signal (EN1) by a first offset 262OFF of 25 pS and the eighth enable signal 218 (EN8) is offset 268OFF from the first enable signal 211 (EN1) by 175 pS, which corresponds to each enable signal from EN1 to EN8 being separated by an offset of 25 pS. The length of each of the enable signals (i.e., 211, 212, 218) is the same with an enable time window of 500 pS. This is illustrated with the first enable signal time window 261 and the second enable time signal 262 having the same duration. In various embodiments the sampling time window lasts from the rise of the first enable signal 211 (EN1) until the fall of the last enable signal, here the eighth enable signal 218 (EN8). As illustrated, the sampling time window 260 lasts for 675 pS.

The first sensing signal 231 (SEN1) may be provided at the end of the sampling time window 260. As illustrated, the second sensing signal 232 (SEN2) is offset from the first sensing signal (SEN1) by a first offset 272OFF of 25 pS and the eighth sensing signal 238 (EN8) is offset 278OFF from the first sensing signal 231 (SEN1) by 175 pS, which corresponds to each sensing signal from SEN1 to SEN8 being separated by an offset of 25 pS. Alternatively, there may be an offset between the first sensing signal 231 (SEN1) and the end of the sampling time window 260. After the eighth sensing window ends, there is a reference voltage delay window 280 (e.g., 20 nS) until the next sensing signal is provided by the FSM 180 (e.g., 231 (SEN1) going from 0 to 1 for the second time). This reference voltage delay window 280 allows for a change in the reference voltage 304 (VREF) as it iterates from the prior voltage to the current reference voltage.

The first sensing signal 231 (SEN1) may have a first sensing signal duration 271, which may be 675 pS. During the first sensing signal duration 271, the first sample 221 (SAMP1) is compared to the current reference voltage 204 (VREF). A change in the sensor output signal 241 (SO1) will occur when the reference voltage 204 (VREF) falls below the sample voltage. As illustrated, the current reference voltage 204 (VREF) is at 1.2V and the first sample 221 (SAMP1) is at 1.145V. Thus the current reference voltage 204 (VREF) is above the voltage of the first sample 221 (SAMP1) and there is no change in the first sensor output 241 (SO1). Similarly, the second sample is compared against the current reference voltage and so on through the eighth sample. At the reference voltage of 1.2 V there are no flags thrown by a change in state of the sensor output signals because the reference voltage is higher than the voltages of the samples. Thus the FSM 180 iterates through other reference voltages (e.g., 1.185V, 1.170V, 1.155V) that are compared to the samples, none of which throw a flag. When the FSM 180 iterates the voltage reference 204 (VREF) to 1.140 V the current reference voltage falls below the voltage 1.145 of each of the samples. Thus the sensor output signals 241 (SO1), 242 (SO2), . . . , 248 (SO8) each throw a flag (e.g., 291, 292 298) by changing values from 1 to 0.

FIG. 3 illustrates a second example timing graph in accordance with one or more embodiments of the present disclosure. The timing graph of FIG. 3 is similar to that of FIG. 2 but in the various embodiments illustrated in FIG. 3 the voltage waveform 304 (VIN) is different than the voltage waveform 204 (VIN) of FIG. 2. The voltage waveform 304 (VIN) is a dynamic voltage waveform that rises from 1 V to 1.190 V then falls to 1 V and then falls again to 0.78 V before rising to 1 V. With this different voltage waveform 306 (VIN) the samples are different values and the flags 391, 392, and 398 are generated at different values of the reference voltage 304 (VREF) as it iterates through voltages.

As illustrated in FIG. 3, there are still 8 samples being taken (e.g., 321 (SAMP1), 322 (SAMP2), . . . , 328 (SAMP8)) based on enable signals (e.g., 311 (EN1), 312 (EN2), . . . , 318 (EN8)). As illustrated, the samples either rise or fall to the sampled voltage of the voltage waveform 306 (VIN) at the rising edge of the associated enable signal (e.g., 311, 312, 318). Each of the enable signals (e.g., 311, 312, . . . , 318) is offset from the prior enable signal by an offset of 25 pS (e.g., 362OFF, 368OFF). The sensing signals are also offset from each subsequent sensing signal (e.g., 332 (SEN2) is offset 372OFF by 25 pS from 331 (SEN1)).

As also illustrated in FIG. 3, once a flag is generated form a sample the comparisons of this sample may end. For example, after flag 391 associated with the first sample 321 (SAMP1) is generated then the FSM 180 did not generate any additional sensing signals 331 (SEN1) associated with comparing the first sample 321 (SAMP1). Similarly, once the flag 392 is generated for the second sample 322 (SAMP2) then no further sensing signals 332 (SEN2) are generated.

It should be readily appreciated that the embodiments of the systems and apparatuses, described herein may be configured in various additional and alternative manners in addition to those expressly described herein.

Exemplary Methods

FIG. 4 illustrates an example flowchart of operations for the oscilloscope circuitry in accordance with one or more embodiments of the present disclosure.

At operation 402, a power down signal is received. A power down signal 146 (PD), 185 (PD) may be received and provided to various components of the oscilloscope circuitry 100. In various embodiments the receipt of a power down signal may be omitted.

At operation 404, reference voltages are generated. The voltages 152 (V(M)) may be generated by a voltage generator 140. The voltages 152 (V(M)) may be provided to the analog buffers (150) for buffering to stabilize these voltage signals.

At operation 406, a data ready signal is generated when the reference voltage(s) are generated. The analog buffers 150 may generate a data ready signal 186 (DATA_READY) when the voltages have been stabilized and are being provided to the switches 160. The data ready signal 186 may be provided to the FSM 180.

At operation 408, enable signals are generated. The digital logic circuitry 110 may generate a plurality of enable signals 124 (EN(N)) to provide to the sample and hold circuitry 120.

At operation 410, a waveform is sampled. A voltage waveform 122 (VIN) may be sampled by one or more sample and hold circuits of the sample and hold circuitry 120 based at least on the enable signals 124 (EN(N)). The sampling of each sample and hold circuit may be for a different portion of the waveform based at least on time offsets between the plurality of enable signals 124 (EN(N)).

At operation 412, a signal is generated to select a first reference voltage and sense signals are generated to begin comparisons. The FSM 180 may generate switch selection signal 164 (B) and provide it to switches 160 to select a first switch of the switches 160. The first switch may close to provide an associated first voltage of the voltages 162 (V(M)) to the high speed buffer 170, which may provide it to the sense amplifier circuitry as the current reference voltage 134 (VREF). The FSM 180 may also generate sensor compare signals 136 (SEN(N)) to begin comparisons of the current reference voltage 134 (VREF) with the samples by the sense amplifiers of the sensing amplifier circuitry 130.

At operation 414, samples are compared to the current reference voltage. The sense amplifier circuitry 130 may compare the current reference voltage 134 (VREF) to the samples and generate sense output signals 181 (SO(N)) and sense output not signals 182 (SON(N)). The comparison may results in a flag being generated in the sense output signals 181 (SO(N)) and sense output not signals 182 (SON(N)).

At operation 416, if the comparisons generate a flag then proceed to operation 420 otherwise proceed to operation 418.

At operation 418, the next reference voltage is selected as the current reference voltage and sense signals are generated. For any samples associated with one or more comparisons that have not generated a flag, the FSM 180 generates a new switch selection signal 164 (B) to select the next voltage of voltages 162 (V(M)) to be the current reference voltage 134 (VREF). The FSM 180 may also generate sensor compare signals 136 (SEN(N)) for comparing the now current reference voltage 134 (VREF) with samples for which a flag has not been generated.

At operation 420, sense amplifier(s) associated with flags are stopped and current reference voltage for sample(s) generating flags are stored with latch(es). For a comparison of a sample resulting in a flag being generated, the comparisons by the associated sense amplifiers are stopped and the associated current reference voltage is stored. The storage of this current reference voltage may be via a latch and/or a register.

At operation 422, if all samples generated a flag then proceed to operation 424 otherwise proceed to operation 418.

At operation 424, set latches. After all samples have been compared to a reference voltage 134 (VREF) that has generated an associated flag, latches in the latching circuitry 190 are set. In various embodiments the latches may be set at or during operation 420.

In various embodiments, once all of the latches have been set then the waveform will have been sampled and voltage values of the samples are stored. The oscilloscope circuitry 100 may be used to sample additional waveforms or portions of the same waveform, such as by proceeding to operation 426. Alternatively or additionally, the values of the waveform sampled and stored may be read out a system and/or apparatus to redraw the waveform of further analyze the waveform, such as by proceeding to operation 428.

At operation 426, a reset signal is generated. The FSM 180 may generate a reset signal 166 (RESET). The resent signal 116 (RESET) may be provided to the sensor circuitry 102 to reset the sensor circuitry 102 for taking additional samples. Additionally or alternatively, the reset signal 116 may also be provided to the latch circuitry 190 to reset the latch circuitry for storing values of new waveforms.

At operation 428, the latches are transmitted. A system or apparatus may read out the values stored in the latch circuitry 190 and/or associated registers and then transmit these values. The values may be transmitted to a processor and or memory for further operations.

At operation 430, a waveform is redrawn. A system of apparatus may redraw the waveform based at least on the values received from the oscilloscope circuitry 100. The redrawn waveform would have a voltage resolution in accordance with the incremental decrements of the voltages in the voltages 152 (V(M)) and a timing resolution in accordance with the offset of the enable signals 124 (EN(N)) used for controlling the sampling of the waveform 122 (VIN).

It will be readily appreciated in various embodiments that one or more blocks of the flowchart may be iterated and/or omitted.

Exemplary Systems and Apparatuses

Embodiments of the present disclosure herein include systems, apparatuses, and methods including and/or using an on chip oscilloscope, such as described herein and which may be implemented in various embodiments.

FIG. 5 illustrates an example block diagram of a device in accordance with one or more embodiments of the present disclosure. The device 500 illustrated may be a system and/or apparatus that includes a processor 502, memory 504, communications circuitry 506, and input/output circuitry 508, and oscilloscope circuitry 100, which may all be coupled via a bus 510.

The processor 502, although illustrated as a single block, may be comprised of a plurality of components and/or processor circuitry. The processor 502 may be implemented as, for example, various components comprising one or a plurality of microprocessors with accompanying digital signal processors; one or a plurality of processors without accompanying digital signal processors; one or a plurality of coprocessors; one or a plurality of multi-core processors; processing circuits; and various other processing elements. The processor may include integrated circuits, such as ASICs, FPGAs, systems-on-a-chip, or combinations thereof. In various embodiments, the processor 502 may be configured to execute applications, instructions, and/or programs stored in the processor 502, memory 504, or otherwise accessible to the processor 502. When executed by the processor 502, these applications, instructions, and/or programs may enable the execution of one or a plurality of the operations and/or functions described herein. Regardless of whether it is configured by hardware, firmware/software methods, or a combination thereof, the processor 502 may comprise entities capable of executing operations and/or functions according to the embodiments of the present disclosure when correspondingly configured. In various embodiments the processor 502 may executing an operation or function for measuring an input from a circuitry of the apparatus or system and/or a supporting device connected to the apparatus or system.

The memory 504 may comprise, for example, a volatile memory, a non-volatile memory, or a certain combination thereof. Although illustrated as a single block, the memory 504 may comprise a plurality of memory components. In various embodiments, the memory 504 may comprise, for example, a random access memory, a cache memory, a flash memory, a hard disk, a circuit configured to store information, or a combination thereof. The memory 504 may be configured to write or store data, information, application programs, instructions, etc. so that the processor 502 may execute various operations and/or functions according to the embodiments of the present disclosure. For example, in at least some embodiments, a memory 504 may be configured to buffer or cache data for processing by the processor 502. Additionally or alternatively, in at least some embodiments, the memory 504 may be configured to store program instructions for execution by the processor 502. The memory 504 may store information in the form of static and/or dynamic information. When the operations and/or functions are executed, the stored information may be stored and/or used by the processor 502.

The communication circuitry 506 may be implemented as a circuit, hardware, computer program product, or a combination thereof, which is configured to receive and/or transmit data from/to another component or apparatus. The computer program product may comprise computer-readable program instructions stored on a computer-readable medium (e.g., memory 504) and executed by a processor 502. In various embodiments, the communication circuitry 506 (as with other components discussed herein) may be at least partially implemented as part of the processor 502 or otherwise controlled by the processor 502. The communication circuitry 506 may communicate with the processor 502, for example, through a bus 510. Such a bus 510 may couple to the processor 502, and it may also couple to one or more other components of the processor 502. The communication circuitry 506 may be comprised of, for example, transmitters, receivers, transceivers, network interface cards and/or supporting hardware and/or firmware/software, and may be used for establishing communication with another component(s), apparatus(es), and/or system(s). The communication circuitry 506 may be configured to receive and/or transmit data that may be stored by, for example, the memory 504 by using one or more protocols that can be used for communication between components, apparatuses, and/or systems.

In various embodiments, the communication circuitry 506 may convert, transform, and/or package data into data packets and/or data objects to be transmitted and/or convert, transform, and/or unpackage data received, such as from a first protocol to a second protocol, from a first data type to a second data type, from an analog signal to a digital signal, from a digital signal to an analog signal, or the like. The communication circuitry 506 may additionally, or alternatively, communicate with the processor 502, the memory 504, the input/output circuitry 508, and/or the oscilloscope circuitry 100, such as through a bus 510.

The input/output circuitry 508 may communicate with the processor 502 to receive instructions input by an operator and/or to provide audible, visual, mechanical, or other outputs to an operator. The input/output circuitry 508 may comprise supporting devices, such as a keyboard, a mouse, a user interface, a display, a touch screen display, lights (e.g., warning lights), indicators, speakers, and/or other input/output mechanisms. The input/output circuitry 508 may comprise one or more interfaces to which supporting devices may be connected, including supporting devices that may generate one or more inputs to be sampled. In various embodiments, aspects of the input/output circuitry 508 may be implemented on a device used by the operator to communicate with the processor 502. The input/output circuitry 508 may communicate with the memory 504, the communication circuitry 506, the oscilloscope circuitry 100, and/or any other component, for example, through a bus 510.

The oscilloscope circuitry 100 may be implemented as circuitry in a system or apparatus. The oscilloscope circuitry 100 may include computer-readable program instructions for operations and/or functions stored on a computer-readable medium and executed by a processor, such as may be in a FSM. In various embodiments, the oscilloscope circuitry 100 may be at least partially implemented as part of the processor 502 or otherwise controlled by the processor 502. The oscilloscope circuitry 100 may communicate with the processor 502, for example, through a bus 510.

Conclusion

Operations and/or functions of the present disclosure have been described herein, such as in flowcharts. As will be appreciated, computer program instructions may be loaded onto a computer or other programmable apparatus (e.g., hardware) to produce a machine, such that the resulting computer or other programmable apparatus implements the operations and/or functions described in the flowchart blocks herein. These computer program instructions may also be stored in a computer-readable memory that may direct a computer, processor, or other programmable apparatus to operate and/or function in a particular manner, such that the instructions stored in the computer-readable memory produce an article of manufacture, the execution of which implements the operations and/or functions described in the flowchart blocks. The computer program instructions may also be loaded onto a computer, processor, or other programmable apparatus to cause a series of operations to be performed on the computer, processor, or other programmable apparatus to produce a computer-implemented process such that the instructions executed on the computer, processor, or other programmable apparatus provide operations for implementing the functions and/or operations specified in the flowchart blocks. The flowchart blocks support combinations of means for performing the specified operations and/or functions and combinations of operations and/or functions for performing the specified operations and/or functions. It will be understood that one or more blocks of the flowcharts, and combinations of blocks in the flowcharts, can be implemented by special purpose hardware-based computer systems which perform the specified operations and/or functions, or combinations of special purpose hardware with computer instructions.

While this specification contains many specific embodiments and implementation details, these should not be construed as limitations on the scope of any disclosures or of what may be claimed, but rather as descriptions of features specific to particular embodiments of particular disclosures. Certain features that are described herein in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

While operations and/or functions are illustrated in the drawings in a particular order, this should not be understood as requiring that such operations and/or functions be performed in the particular order shown or in sequential order, or that all illustrated operations be performed, to achieve desirable results. In certain circumstances, operations and/or functions in alternative ordering may be advantageous. In some cases, the actions recited in the claims may be performed in a different order and still achieve desirable results. Thus, while particular embodiments of the subject matter have been described, other embodiments are within the scope of the following claims.

While this detailed description has set forth some embodiments of the present invention, the appended claims cover other embodiments of the present invention which differ from the described embodiments according to various modifications and improvements.

Within the appended claims, unless the specific term "means for" or "step for" is used within a given claim, it is not intended that the claim be interpreted under 35 U.S.C. § 112, paragraph 6.

The invention claimed is:

1. An oscilloscope circuitry comprising:

a sensor circuitry including a sample and hold circuitry and a sense amplifier circuitry, wherein the sample and hold circuitry is configured to generate a plurality of samples based at least on a voltage waveform;

a voltage generation circuitry including an output coupled to the sense amplifier circuitry, wherein the output is configured to provide a reference voltage;

a finite state machine coupled to the sensor circuitry and the voltage generation circuitry, wherein the finite state machine is configured to operate the sensor circuitry and voltage generation circuitry to compare the plurality of samples to the reference voltage and generate a plurality of flags, wherein comparing each of the plurality of samples to the reference voltage generates a flag of the plurality of flags when a sample exceeds the reference voltage; and a latch circuitry coupled to the finite state machine, wherein the latch circuitry is configured to store a plurality of outputs generated based on the flag.

2. The oscilloscope circuitry of claim 1, wherein the voltage waveform is a dynamic waveform.

3. The oscilloscope circuitry of claim 1, wherein the sample and hold circuitry comprises a plurality of sample and hold circuits, wherein the sense amplifier circuitry comprises a plurality of sense amplifiers, and wherein each sense amplifier of the plurality of sense amplifiers is associated with one sample and hold circuit of the sample and hold circuitry.

4. The oscilloscope circuitry of claim 1, wherein the voltage generation circuitry is configured to generate the reference voltage based at least on a selection of one of a plurality of voltages.

5. The oscilloscope circuitry of claim 4, wherein the selection of the plurality of voltages changes over time based on an input from the finite state machine to the voltage generation circuitry.

6. The oscilloscope circuitry of claim 5, wherein the changes over time to the selection of the plurality of voltages decrements the reference voltage over time.

7. The oscilloscope circuitry of claim 1, wherein a plurality of sample and hold circuits are configured to sample the voltage waveform a different time that is a sample time offset from a previous time the voltage waveform is sampled.

8. An apparatus comprising:

an oscilloscope circuitry comprising:

a sensor circuitry including a sample and hold circuitry and a sense amplifier circuitry, wherein the sample and hold circuitry is configured to generate a plurality of samples based at least on a voltage waveform;

a voltage generation circuitry including an output coupled to the sense amplifier circuitry, wherein the output is configured to provide a reference voltage;

a finite state machine coupled to the sensor circuitry and the voltage generation circuitry, wherein the finite state machine is configured to operate the sensor circuitry and voltage generation circuitry to compare the plurality of samples to the reference voltage and generate a plurality of flags, wherein comparing of each of the plurality of samples to the reference voltage generates a flag of the plurality of flags when a sample exceeds the reference voltage;

a latch circuitry coupled to the finite state machine, wherein the latch circuitry is configured to store a plurality of outputs generated based on the flag; and a display configured to render the stored plurality of outputs as a waveform.

9. The apparatus of claim 8, wherein the voltage waveform is a dynamic waveform.

10. The apparatus of claim 8, wherein the sample and hold circuitry comprises a plurality of sample and hold circuits, wherein the sense amplifier circuitry comprises a plurality of sense amplifiers, and wherein each sense amplifier of the plurality of sense amplifiers is associated with one sample and hold circuit of the sample and hold circuitry.

11. The apparatus of claim 8, wherein the voltage generation circuitry is configured to generate the reference voltage based at least on a selection of one of a plurality of voltages.

12. The apparatus of claim 11, wherein the selection of the plurality of voltages changes over time based on an input from the finite state machine to the voltage generation circuitry.

13. The apparatus of claim 12, wherein the changes over time to the selection of the plurality of voltages decrements the reference voltage over time.

14. The apparatus of claim 8, wherein a plurality of sample and hold circuits are configured to sample the voltage waveform a different time that is a sample time offset from a previous time the voltage waveform is sampled.

15. A method comprising:

sampling a voltage waveform to generate a plurality of samples with a sample and hold circuitry;

transmitting the plurality of samples from the sample and hold circuitry to a sense amplifier circuitry;

generating, by a voltage generation circuitry, a reference voltage;

transmitting the reference voltage from the voltage generation circuitry to the sense amplifier circuitry;

comparing, by the sense amplifier circuitry, the plurality of samples to the reference voltage based at least on a plurality of sensor compare signals generated by a finite state machine;

generating, by the sense amplifier circuitry, one or more flags based on the comparing of the plurality of samples to the reference voltage when each sample of the plurality of samples exceeds the reference voltage;

storing, by latching circuitry, a plurality of outputs generated based on the one or more flags;

a latch circuitry coupled to the finite state machine, wherein the latch circuitry is configured to store the plurality of outputs generated based on the one or more flags.

16. The method of claim 15, wherein the voltage waveform is a dynamic waveform.

17. The method of claim 15, wherein the sample and hold circuitry comprises a plurality of sample and hold circuits, wherein the sense amplifier circuitry comprises a plurality of sense amplifiers, and wherein each sense amplifier of the plurality of sense amplifiers is associated with one sample and hold circuit of the sample and hold circuitry.

18. The method of claim 15, wherein generating the reference voltage is based at least on a selection of one of a plurality of voltages.

19. The method of claim 18, further comprising:

generating, by the finite state machine, an output for selecting the one of the plurality of voltages for the reference voltage;

transmitting the output for selecting the one of the plurality of voltages from the finite state machine to the voltage generation circuitry;

changing, by the finite state machine, the output for selecting the one of the plurality of voltages for the reference voltage over time; and changing, by the voltage generation circuitry, the reference voltage based at least on changes of the output for selecting the one of the plurality of voltages for the reference voltage.

20. The method of claim 19, wherein the changes over time to the selection of the plurality of voltages decrements the reference voltage over time.

* * * * *